(12) United States Patent
Saida et al.

(10) Patent No.: US 8,142,060 B2
(45) Date of Patent: Mar. 27, 2012

(54) LIGHT SOURCE AND VEHICLE LAMP

(75) Inventors: Takahiro Saida, Tokyo (JP); Kazuhiko Ueno, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 504 days.

(21) Appl. No.: 12/372,831

(22) Filed: Feb. 18, 2009

(65) Prior Publication Data
US 2009/0244921 A1 Oct. 1, 2009

(30) Foreign Application Priority Data

Feb. 20, 2008 (JP) ................................. 2008-038988

(51) Int. Cl.
*F21S 8/10* (2006.01)
(52) U.S. Cl. ............. 362/539; 362/545; 257/98; 257/99
(58) Field of Classification Search .................. 362/539, 362/545; 257/91, 89, 81, 79, 88, 98, 99, 257/E33.066, E33.068; 313/114, 499
See application file for complete search history.

(56) References Cited

U.S. PATENT DOCUMENTS

| | | | | |
|---|---|---|---|---|
| 6,335,548 B1* | 1/2002 | Roberts et al. | ................... | 257/98 |
| 6,417,524 B1* | 7/2002 | Alphonse | .......................... | 257/91 |
| 6,958,498 B2* | 10/2005 | Shelton et al. | .................. | 257/99 |
| 7,019,334 B2 | 3/2006 | Yatsuda et al. | | |
| 7,210,831 B2* | 5/2007 | Ishida | .......................... | 362/539 |

FOREIGN PATENT DOCUMENTS

| | | |
|---|---|---|
| JP | 2005005193 | 1/2005 |
| JP | 2005085549 | 3/2005 |
| JP | 2005085895 | 3/2005 |

* cited by examiner

*Primary Examiner* — Sharon Payne
(74) *Attorney, Agent, or Firm* — Kenealy Vaidya LLP

(57) ABSTRACT

The disclosed subject matter includes light sources that have high use efficiency and a favorable bright distribution, and includes vehicle lamps that have both a favorable light distribution pattern and a capability of being simply composed by using the LED light sources. The light source can include a base board, at least one die bonding pad and wire bonding pad on the base board, at least one LED chip mounted on the die bonding pad and connected to respective bonding pads, and an encapsulating resin over the LED chip. The at least one LED chip can emit a uniform light with a distribution electrode on a top surface thereof and can form a favorable light distribution using a shield electrode on the top surface. The vehicle lamp can include the light source and an optical lens selected according to a kind and/or design of a vehicle lamp.

25 Claims, 13 Drawing Sheets

Fig.10
(A)
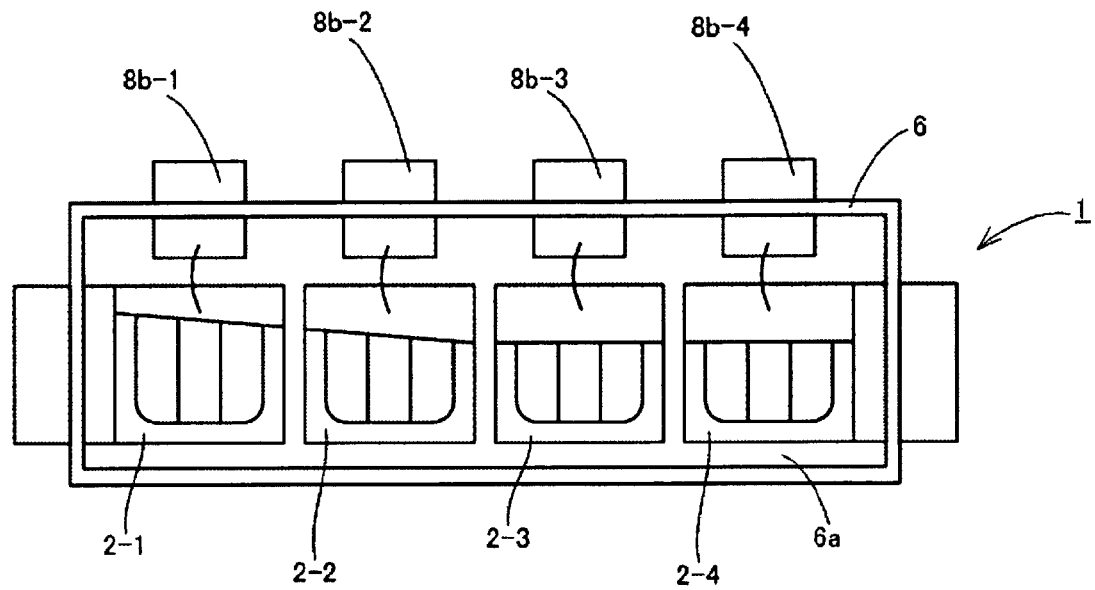
(B)
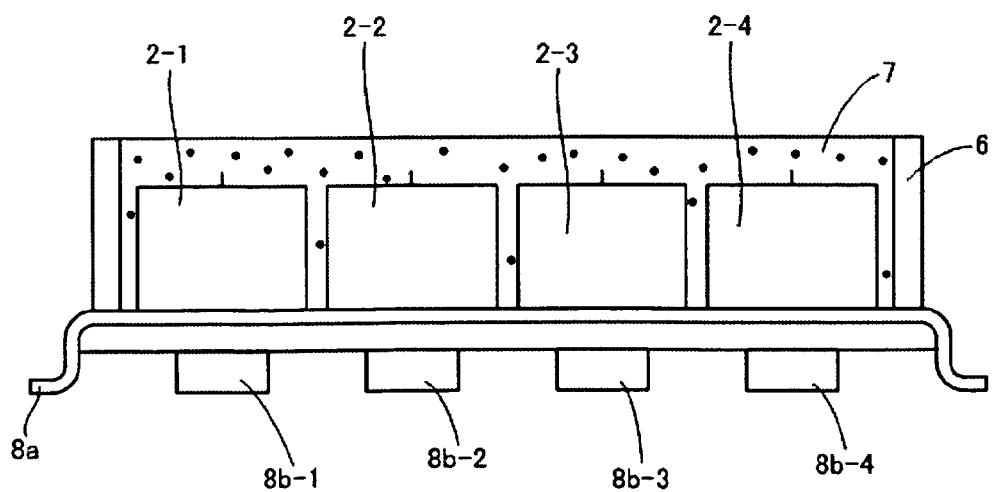

LIGHT SOURCE AND VEHICLE LAMP

This application claims the priority benefit under 35 U.S.C. §119 of Japanese Patent Application No. 2008-038988 filed on Feb. 20, 2008, which is hereby incorporated in its entirety by reference.

BACKGROUND

1. Field

The presently disclosed subject matter relates to a light source and a vehicle lamp, and more particularly to a light source device using at least one LED chip and to a vehicle lamp such as a headlight, auxiliary headlight, or other vehicle lamp using the light source device.

2. Description of the Related Art

A conventional light source device using at least one LED chip for a vehicle lamp is disclosed in patent document No. 1 (Japanese Patent Application Laid Open JP2005-005193). FIG. 11 is a perspective view showing a conventional LED light source disclosed in patent document No. 1. FIG. 12 is a cross-section view of the conventional LED light source taken along line A-A shown in FIG. 11.

The conventional LED light source 90 includes: a blue LED chip 92 mounted in a metallic casing 91 and electrically connected to electrodes for receiving a power supply; a yellow phosphor 93 covering the LED chip 92; a transparent material 91a such as a glass and the like sealing both the LED chip 92 and the yellow phosphor 93 along with the metallic casing 91; and a shield material 94 located underneath the transparent material 91a.

The yellow phosphor 93 can convert a blue light emitted from the blue LED chip 92 into a yellow light, and therefore the blue light of the blue LED chip 92 is converted into a white light via a yellow/blue color mixture. In this case, the shield material 94 can form such a shape as to shield a portion of the emitted light in order to conform to a light distribution standard for a vehicle lamp.

Thus, the conventional LED light source 90 can emit such a white light as to be able to conform to a light distribution standard for a vehicle lamp via the transparent material 91a by changing the shape of the shield material 94. More specifically, when designing a vehicle lamp using the LED light source 90, the vehicle lamp can be composed by locating an aspheric lens in front of the LED light source 90 which includes shield material 94 that is formed in a shape that conforms to a light distribution standard. The reason is that the light emitted from the LED light source 90 can be enlarged and projected ahead via the aspheric lens in accordance with the shape of the shield material 94.

However, when a headlight for a low beam is composed of the conventional LED light source 90, approximately half of the light emitted from the blue LED chip 92 can be shielded by the shield material 94 due to shielding an upward glare light. Thus, the light use efficiency of the light source 90 may be low, and also the power efficiency may be low because a power supply is used for both the unshielded light and for the shielded light. In addition, the low power efficiency may cause such a problem as generating a large amount of heat.

LED chips for the light source that may solve the above-described problem are disclosed in patent document No. 2 (Japanese Patent Application Laid Open JP2005-085549) and patent document No. 3 (Japanese Patent Application Laid Open JP2005-085895). FIG. 13 is a perspective view showing a conventional LED chip for a light source disclosed in patent documents No. 2 and 3.

The conventional LED chip 80 includes: a sapphire substrate 81; a n-type semiconductor layer 82 formed on the sapphire substrate 81; another n-type semiconductor layer 82a formed in a shape of a light distribution pattern and formed on the n-type semiconductor layer 82 and; a p-type semiconductor layer 83 formed on the other n-type semiconductor layer 82a, and a light-emitting layer 84 formed at a boundary surface between the other n-type semiconductor layer 82a and the p-type semiconductor layer 83; a p-type electrode 85 formed on the p-type semiconductor layer 83; and a n-type electrode 86 formed on the n-type semiconductor layer 82.

According to the structure of the LED chip, the LED chip 80 can emit light having a light distribution pattern emitted in accordance with the shape of the other n-type semiconductor layer 82a. Thus, because the LED chip 80 may not emit light that is subsequently shielded for a vehicle lamp, the light use efficiency thereof may be high.

The above-referenced Patent Documents are listed below, and are hereby incorporated with their English abstracts in their entireties.

1. Patent Document No. 1: Japanese Patent Application Laid Open JP2005-005193
2. Patent Document No. 2: Japanese Patent Application Laid Open JP2005-085549
3. Patent Document No. 3: Japanese Patent Application Laid Open JP2005-085895

In the above-described LED light source 90 shown in FIGS. 11 and 12, if the light-emitting area thereof can become large and the light intensity thereof can become high, the LED light source 90 may be more favorable to a vehicle lamp using it. The reason is that the vehicle lamp can illuminate a predetermined area with a high brightness while maintaining a low enlargement factor for the aspheric lens.

However, the light source 90 can be required to enlarge the size of the LED chip 92 therein and/or can be required to increase the number of the LED chip 92 in order to achieve the above-described characteristics, and therefore a driving current thereof might be increased. Thus, the power efficiency of the light source 90 may become lower, and the lower power efficiency thereof may cause a larger amount of heat. Moreover, because some of the emitted light is shielded by the shield material 94 may increase, the light use efficiency may also become lower.

In the above-described LED chip 80 shown in FIG. 13, because it may be possible to use all of the light emitted from the light-emitting layer 84 thereof, the power efficiency of the LED chip 80 may certainly improve with respect to the amount of light emitted from the vehicle lamp using it. However, it can be difficult to form such the light-emitting layer 84 as the above-described shape of light distribution pattern in the manufacturing process of the LED chip 80.

For instance, after a light-emitting layer can be formed by growing a p-type semiconductor layer over all or most the n-type semiconductor layer 82, the light-emitting layer 84 may be required to form a favorable shape using an etching, etc. Therefore, because the manufacturing process may become complex and may require a high processing accuracy, such problems as decreasing a yield, increasing the number of the manufacturing process and the like may result. In addition, the vehicle lamp using the LED chip 80 may include such a problem that a bonding wire shown in FIG. 13 can cause a shadow in the light distribution pattern thereof.

The disclosed subject matter has been devised to consider the above and other problems and characteristics. Thus, an embodiment of the disclosed subject matter can include LED light sources with high light use efficiency and a favorable brightness distribution and which can be made with a simple manufacturing process, and can include vehicle lamps with a favorable light distribution pattern and which also can be simply composed by using the LED light sources.

SUMMARY

The presently disclosed subject matter has been devised in view of the above and other characteristics, desires, and problems in the conventional art, and to make certain changes to the existing light sources. An aspect of the disclosed subject matter includes providing vehicle lamps with a more favorable light distribution pattern than using a conventional LED light source and which also can be simple composed by using the LED light sources of the disclosed subject matter.

According to another aspect of the disclosed subject matter, a light source device for vehicle lamps can include: a base board; at least one die bonding pad provided on the base board and electrically connected to one electrode of the light source device; at least one wire bonding pad provided on the base board and located adjacent the at least one die bonding pad and electrically connected to another electrode of the light source device; at least one LED chip mounted on the at least one die bonding pad and an electrode thereof electrically connected to the at least one die bonding pad, another electrode thereof formed on an edge portion of top surface thereof and located adjacent the at least one wire bonding pad and electrically connected to the at least one wire bonding pad via a bonding wire; and an encapsulating resin disposed in order to encapsulate both the at least one LED chip and the bonding wire.

In the above-described exemplary light source device, the light source device for vehicle lamps can further include a distribution electrode that is formed in thin lines on the top surface of the at least one LED chip and is connected to the other electrode on the top surface, and also can include a wavelength-conversion material that covers at least an exposed surface on the top surface of the at least one LED chip.

According to the exemplary light source device, the at least one LED chip can emit a uniform light with a distribution electrode on the top surface thereof, and the bonding wire cannot cross the uniform light. In addition, because the light source device can emit various colors of light with the LED chip and using the wavelength-conversion material, the light source device can be used as a light source for various vehicle lamps.

In the above-described exemplary light source, the at least one LED chip can further include a shield electrode that is formed on the top surface of the at least one LED chip so that an edge line thereof substantially corresponds with an edge line of the top surface and is located adjacent the at least one wire bonding pad, and another edge line thereof opposite the edge line is formed in a straight line on the top surface. The shield electrode can be electrically connected to the at least one wire bonding pad via a bonding wire instead of the other electrode that is formed on the top surface.

In the immediately above-described exemplary light source, the shield electrode can be electrically connected to the at least one wire bonding pad at a closer position to the other edge line opposite the edge line than the edge line thereof via the bonding wire. In addition, the at least one LED chip can include a reflecting layer that is located between the top surface of the at least LED chip and the shield electrode so as to directly contact between a part of the shield electrode and the top surface of the at least LED chip at a close position to the other edge line of the shield electrode. Furthermore, the at least one LED chip can be a plurality of LED chips adjacent with respect to each other, and at least one other edge line of shield electrode of the plurality of LED chips can slant to at least another other edge line of shield electrode of the plurality of LED chips.

Thus, the light source device can form various light distribution patterns such as including a cut-off line in a low beam of headlight and the like, and also can illuminate with a brighter light on an area under the cut-off line. In addition, the light use efficiency of the light source device can be improved because the reflecting layer can reflect a light that may be absorbed in the shield electrode and the reflected light can be emitted outside.

Another of the aspects of the disclosed subject matter includes a vehicle lamp that can include the above-described light source device and a projection lens or other lens. Each color tone and brightness of the LED chips in the light source device can be also adjusted by changing the driving current. As described above, the vehicle lamps can form a more favorable light distribution pattern as compared to those using a conventional LED light source, and can also be simply composed by the LED light source device and the optical lens.

BRIEF DESCRIPTION OF THE DRAWINGS

These and other characteristics and features of the disclosed subject matter will become clear from the following description with reference to the accompanying drawings, wherein:

FIGS. 10(A), (B) are respectively schematic top and side cross-section views showing an exemplary location using four LED chips for a light source device made in accordance with principles of the disclosed subject matter;

DETAILED DESCRIPTION OF EXEMPLARY EMBODIMENTS

Figure 1:
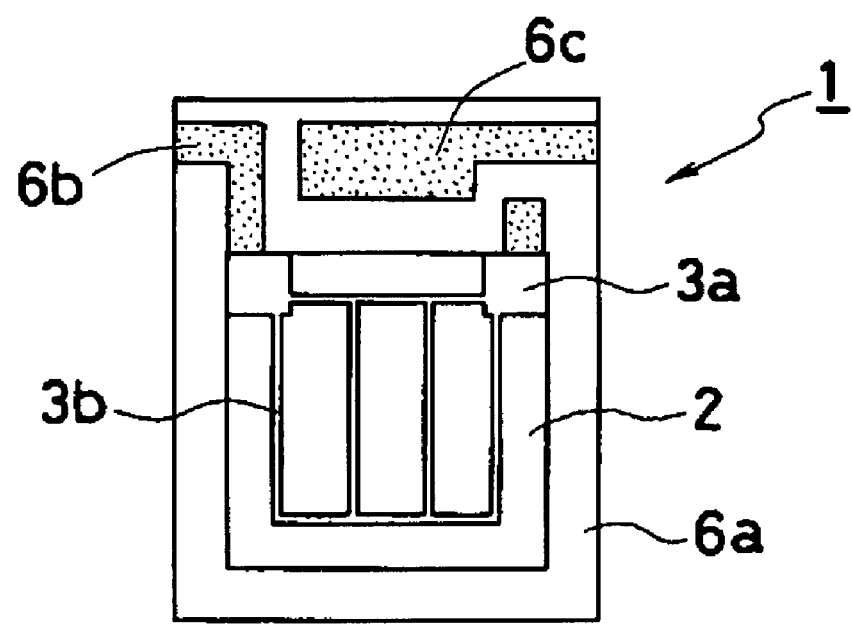
FIG. 1 is a schematic top view showing a basic structure for an exemplary embodiment of a light source device made in accordance with principles of the disclosed subject matter.

The disclosed subject matter will now be described in detail with reference to FIGS. 1 to 10. FIG. 1 is a schematic top view showing a basic structure for an exemplary embodiment of a light source device made in accordance with principles of the disclosed subject matter. A light source 1 is a basic LED light source device that is composed of an LED chip 2, which can be respectively a red LED, a yellow LED, a blue LED, a mixture chip and the like in a taillight, a fog lamp, a headlight, etc. The mixture chip can include a red LED chip, a green LED chip and a blue LED chip.

The LED chip 2 can be mounted on a base board 6a via an adhesive material, etc. The base board 6a can be composed of a ceramic substrate such as $Al_2O_3$, AlN, SiC, $Si_3N_4$, or $ZrO_2$, and the like. The base board 6a can include both a die bonding pad 6b and a wire bonding pad 6c on a surface thereof and each of their bonding pads 6b, 6c can include a plurality of chip mounting portions and a plurality of wire bonding pads, which can be electrically connected to a circuit board via electrodes of the light source 1 by leading them on and/or under the base board 6a.

The bonding pads 6b, 6c can be connected to the electrodes of the light source 1 for receiving a power supply via the circuit board. The electrodes of the light source 1 can be composed of the respective lead frames, and the lead frames can also be used as the above-described bonding pads 6b, 6c by extending onto the base board 6a.

The LED chip 2 can be mounted on the chip mounting portion of the die bonding pad 6b via a solder, an Ag-paste, and the like, and can be electrically connected to the die bonding pad 6b at the same time when one of electrodes of the LED chip 2 is formed on a bottom surface thereof. If the electrode is not formed on the bottom surface of the LED chip 2, the electrode can be electrically connected to the die bonding pad 6b via a bonding wire.

Figure 11:
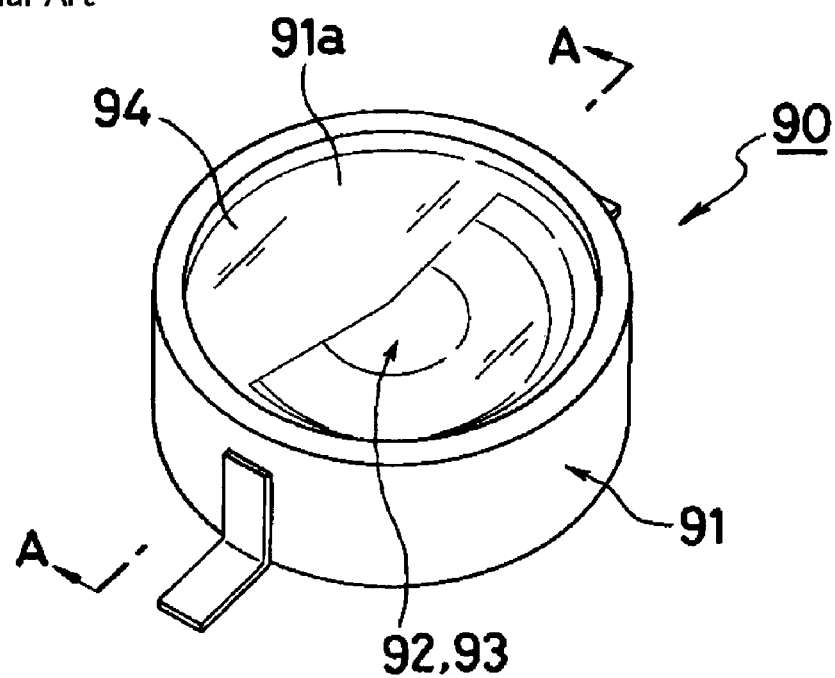
FIG. 11 is a perspective view showing a conventional LED light source for a vehicle lamp.
Figure 12:
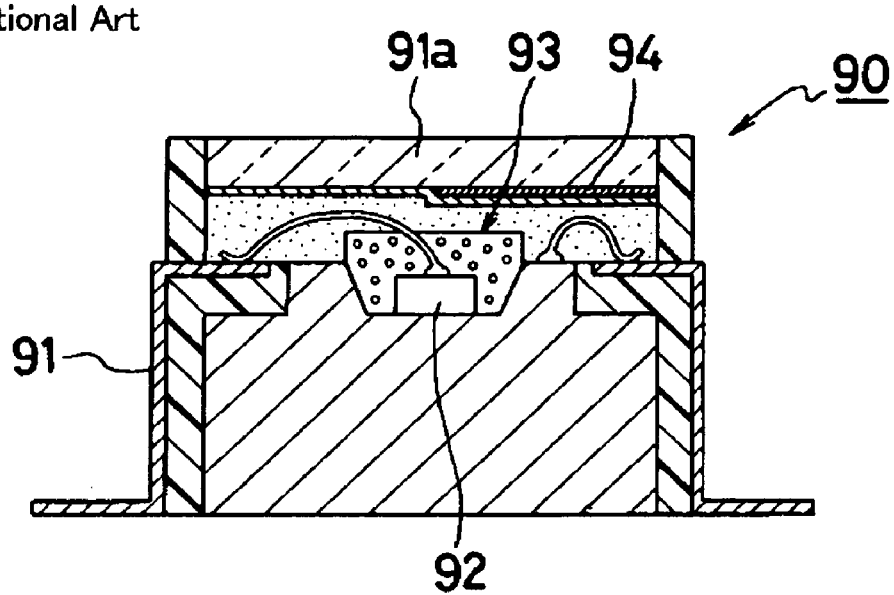
FIG. 12 is a cross-section view of the conventional LED light source along line A-A shown in FIG. 11.
Figure 13:
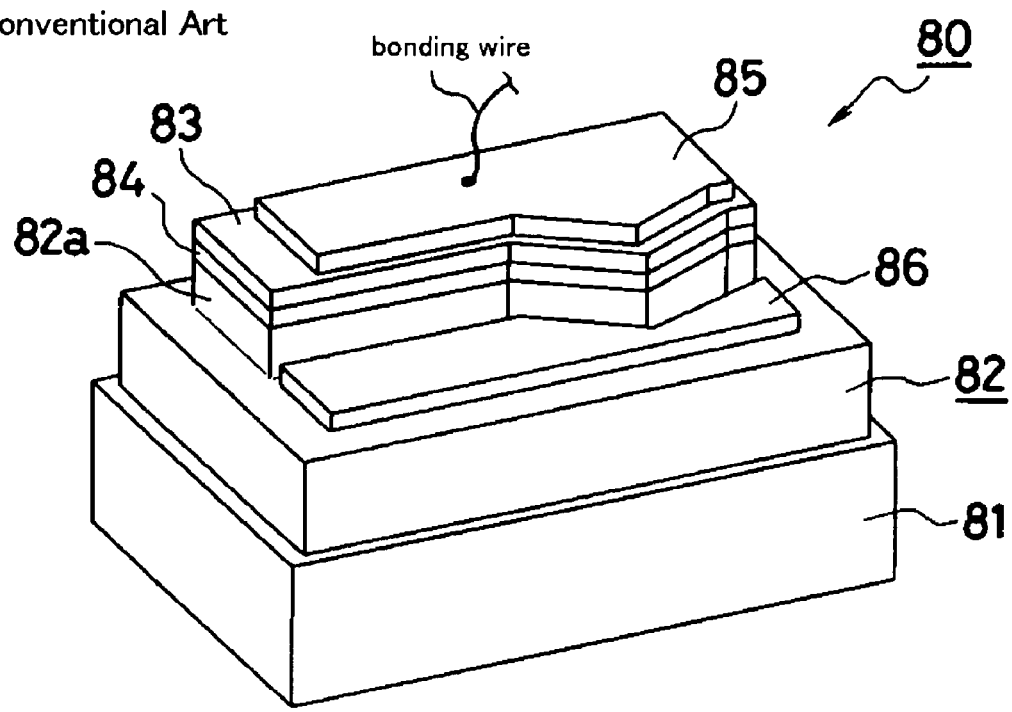
FIG. 13 is a perspective view showing a conventional LED chip for a light source of a vehicle lamp.

A top electrode 3a can be located on an edge portion of the top surface as another electrode of the LED chip 2, and can be composed of Au, etc. The top electrode 3a can include an edge portion adjacent the wire bonding pad 6c, and the adjacent edge portion thereof can be electrically connected to the wire bonding pad 6c via a bonding wire. Thus, because the bonding wire does not cross over a light-emitting surface of the LED chip 2, unlike the conventional LED chips shown in FIGS. 11 to 13, vehicle lamps using the light source device 1 does not project a shadow in a light distribution pattern thereof.

The LED chip 2 can be configured to include a distribution electrode 3b that is formed in thin lines such as a plurality of strips on the top surface thereof, and can be configured to connect the distribution electrode 3b to the top electrode 3a. Thus, because a substantially uniform current can flow in a semiconductor layer described later, the LED chip 2 can emit a uniform light on the light-emitting surface located between the strips, as compared to an LED chip 2 that does not include a distribution electrode 3b formed as thin lines or as a plurality of strips.

When a taillight is composed of the light source 1 using the LED chip 2, the taillight can be configured to employ a red LED chip as the LED chip 2 and can be configured such that a lens having a favorable shape is located in front of the light source 1. In this case, according to a size of the taillight, the shape and the like, the taillight with a favorable light distribution can be constructed by increasing the number of the light source 1 in moderation and by locating the plurality of light sources 1 adjacent with respect to each other, etc.

When constructing a fog lamp as the light source 1 using the LED chip 2, the fog lamp can be configured to use a yellow LED chip as the LED chip 2 and can be configured such that a projection lens is located in front of the light source 1. In this case, according to a size and required brightness of the fog lamp and a brightness of the LED chip 2, the fog lamp with a favorable brightness and light distribution pattern can be composed by changing the shape of the projection lens, by increasing the number of the LED chip 2 mounted on the base board 6a of the light source 1, etc.

When the number of the LED chip 2 is increased, the wire bonding pad 6c can increase outwards so that a bonding wire does not cross over a light-emitting surface of the LED chip 2. For instance, when two LED chips 2 are used as a light source 1, two wire bonding pads 6c can be located on top and under portions outwards on the base board 6a so as to sandwich the two LED chips 2 between the two wire bonding pads 6c. Alternatively, the two wire bonding pads 6c can be located on left and right portions outwards on the base board 6a so as to sandwich the two LED chips 2 between the two wire bonding pads 6c.

In the above-described structure of a vehicle lamp that is constructed of the light source 1 using the yellow LED chip 2, the vehicle lamp can also be used as a turn signal lamp by changing the projection lens into a lens for a turn signal lamp and by blinking the light source 1 with a blinker circuit. Depending on the size and shape of the turn signal lamp, the number of LED chips 2 mounted on the base board 6a of the light source 1 and the number of light sources 1 can be selected to conform within a regulation for a turn signal lamp.

When a headlight for a high beam includes the light source 1, the high beam headlight can be configured to employ a white LED light source (described later) and can be configured to include a projection lens located in front of the white light source 1. In this case, depending on the size of the headlight, the brightness of the light source 1 and the like, a headlight with a favorable brightness and light distribution pattern can be composed by changing the shape of the projection lens, by increasing the number of LED chips 2 on the base board 6a of the light source 1, by changing a distance between the projection lens and the light source 1, etc.

In addition, an auxiliary headlight such as a spot lamp, a driving lamp and the like can also be configured with the immediately above-described structure by a simple modification of the projection lens, etc. Similarly, a daytime running lamp can also be configured with the above structure. In this case, because the daytime running lamp is a daylight signaling lamp rather than an illuminating light, the daytime running lamp can have a decreased brightness of the light source 1 therein by using a low power LED chip as the LED chip 2, by reducing the driving current for the light source 1, etc.

Figure 2:
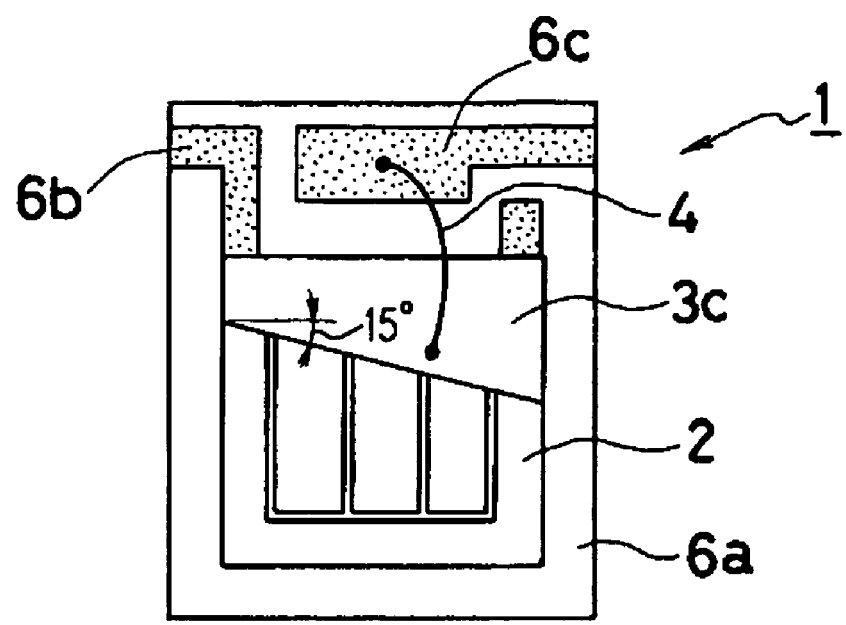
FIG. 2 is a schematic top view showing a structure for an exemplary embodiment of an LED chip including a shield electrode in the light source device shown in FIG. 1.

A light source that can form such a cut-off line as an elbow line in a light distribution pattern of a headlight for a low beam will now be described with reference to FIGS. 2 and 3. FIG. 2 is a schematic top view showing a structure for an exemplary embodiment of an LED chip including a shield electrode 3c in the light source 1 shown in FIG. 1. A difference between the light sources 1 of FIGS. 1 and 2 can include the shield electrode 3c as shown in FIG. 2.

The shield electrode 3c can be configured on the top surface of the LED chip 2 so as to cover both the top electrode 3a and a part of the light-emitting surface adjacent the top electrode 3a, and a first edge line thereof can substantially align with an edge line of the top surface of the LED chip 2 and can be located adjacent the wire bonding pad 6c. A second edge line of the shield electrode 3c opposite the edge line of the shield electrode 3c can be formed in a straight line on the top surface of the LED chip 2.

The shield electrode 3c can be connected to the wire bonding pad 6c via a bonding wire 4 instead of the top electrode 3a, and can shield a part of light emitted from the light-emitting surface therewith along the straight line. In this case, because the shield electrode 3c can extend wider and longer on the semiconductor layer than the top electrode 3a shown in FIG. 1, the light-emitting surface shown in FIG. 2 may emit more uniform light as compared to when a distribution electrode 3b is used.

When the above-described second edge line of the shield electrode 3c substantially aligns with a horizontal line on a projecting surface of the light source 1, the second edge line can form a horizontal cut-off line on the projecting surface. When the second edge line is slanted at an angle, for example, approximately fifteen degrees to the horizontal line as shown in FIG. 2, the second edge line of the shield electrode 3c can form an elbow line having a slant angle of approximately fifteen degrees to the above horizontal line. Thus, the light source 1 including the shield electrode 3c can form various light distribution patterns having a cut-off line according to a light distribution standard therefore.

In addition, when the shield electrode 3c can be electrically connected to the wire bonding pad 6c at a position closer to the second edge line than the first edge line via the bonding wire 4, the light distribution pattern can be more favorable to a headlight for a low beam because a portion under the cut-off line can become brighter by concentrating current density at the closer position to the second edge line on the shield electrode 3c. A light source for a low beam will now be given in more detail.

Figure 3:
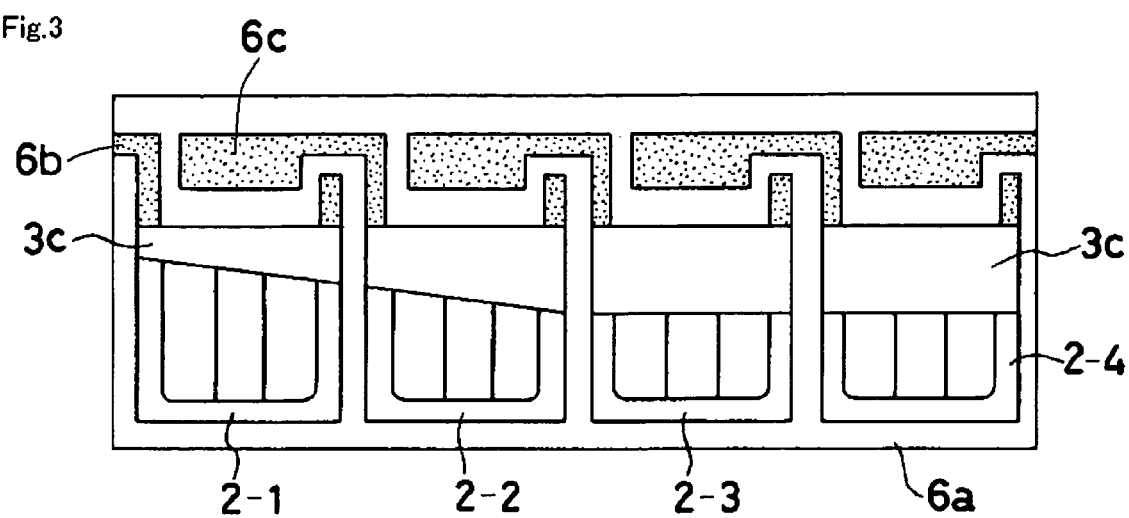
FIG. 3 is a schematic top view showing a basic structure for an exemplary embodiment of a light source device incorporated in a headlight for a low beam.

FIG. 3 is a schematic top view showing a basic structure for an exemplary embodiment of a light source incorporated in a headlight for a low beam. The light source 1 for a low beam of a headlight of which vehicle keeps to one side of the road can include four LED chips 2-1 to 2-4. Each second edge line of the shield electrodes 3c on the LED chips 2-3 and 2-4 can correspond to a horizontal line on the projecting surface of the light source 1, and therefore these second edge lines can form the horizontal cut-off line on an oncoming lane so as not to cause glare for an oncoming driver.

Each second edge line of the shield electrodes 3c in the LED chips 2-1 and 2-2 can be inclined approximately at a fifteen degree angle relative to the second edge lines of the LED chips 2-3 and 2-4. Thus, the second edge lines on the LED chips 2-1 and 2-2 can form the slightly leftward-upward cut-off line on a driving lane so as to be easily able to illuminate a road sign, a pedestrian, etc. Because their four LED chips 2-1 to 2-4 shown in FIG. 3 can be connected in series and two electrodes of the light source 1 can receive a power supply, the structure of the electrodes can become simple.

When each of four LED chips can be connected in parallel, each brightness and color tone of four LED chips can be adjusted by changing each driving current. When the LED chips 2-1 and 2-2 and the LED chips 2-3 and 2-4 can be respectively connected in series, the connecting method may be useful to a vehicle lamp because each brightness and color tone of the LED chips 2-1 and 2-2 formed as a slant angle and the LED chips 2-3 and 2-4 formed as a horizontal line can be respectively adjusted.

Although four LED chips 2-1 to 2-4 are described above with reference to the light source 1 shown in FIG. 3, other amounts and combinations and arrangements of LEDs chips are contemplated that would fall within the scope of the disclosed subject matter. For example, two LED chips can be configured and other numbers of LED chips can be also configured similarly. For example, a single LED chip having both a slant angle and a horizontal line can also be configured on the base board 6a. Under the above-described LED chip, the LED chip shown in FIG. 1 can also be located when it is desirable for the headlight to brightly illuminate at a lower position opposite the cut-off line in the light distribution pattern.

Figure 4:
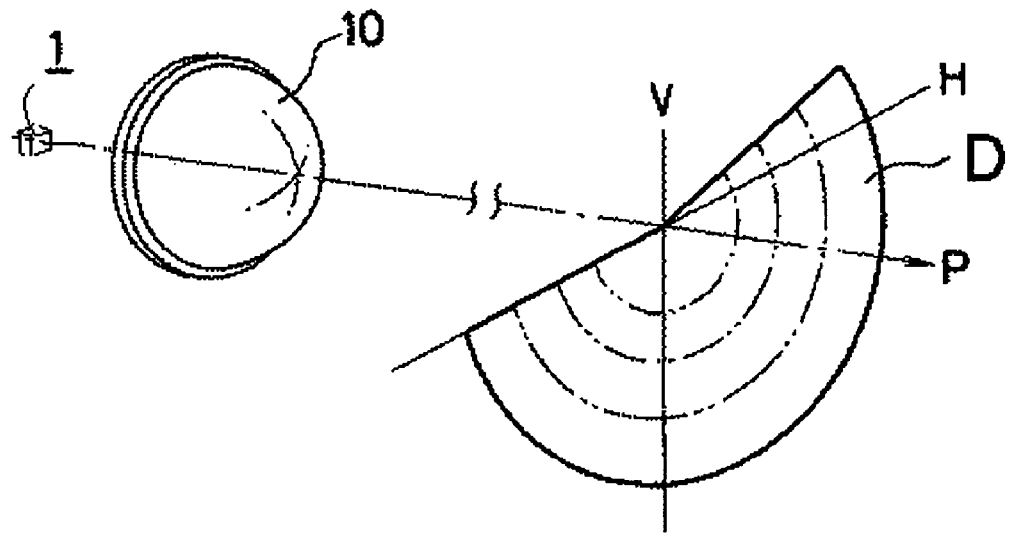
FIG. 4 is a schematic perspective view showing a basic structure of a headlight for a low beam using the light source device of FIG. 3 and the light distribution pattern in accordance with the headlight for a low beam.

FIG. 4 is a schematic perspective view showing a basic structure of a headlight for a low beam using the light source of FIG. 3 and the light distribution pattern thereof. When composing a headlight for a low beam, the headlight can be composed by locating a projection lens 10 in front of the light source 1 shown in FIG. 3. The light emitted from the light source 1 can form the light distribution pattern D via the projection lens 10. The light distribution pattern D can be enlarged and projected the flip horizontal light emitted from the light source 1 via the projection lens 10. Lines P, H and V shown in FIG. 4 represent an optical axis of the projection lens 10, a horizontal axis of the light distribution pattern D and a vertical axis, respectively.

Figure 5:
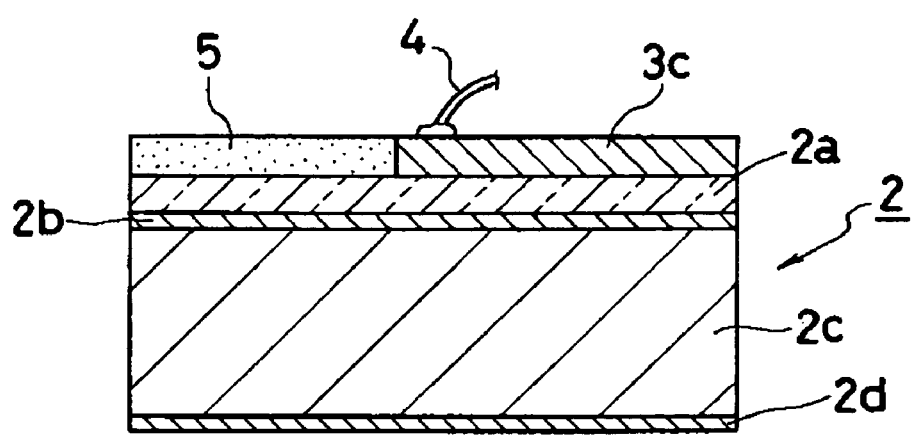
FIG. 5 is a schematic cross-section view showing a structure for an exemplary embodiment of an LED chip including a wavelength-conversion material in a light source device made in accordance with principles of the disclosed subject matter.

A light source emitting a white light will now be described in detail with reference to FIGS. 5 to 10. FIG. 5 is a schematic cross-section view showing a structure for an exemplary embodiment of an LED chip including a wavelength-conversion material in a light source made in accordance with principles of the disclosed subject matter. When a white light is emitted from the LED chip 2 shown in FIG. 5, for example, a blue LED chip can be used as the LED chip 2 and a yellow phosphor 5 can be employed as the wavelength material covering on the blue LED chip.

The white LED chip 2 can include: a substrate 2c; a bottom electrode 2d located underneath the substrate 2c; a metallic layer 2b formed on the substrate 2c; a semiconductor layer 2a formed on the metallic layer 2b, the semiconductor layer 2a including a light-emitting layer for emitting a blue light; a shield electrode 3c formed on the semiconductor layer 2a in accordance with the above-described shape; and the yellow phosphor 5 formed on at least an exposed surface of the semiconductor layer 2a that is a portion of the top surface of the LED chip 2.

The yellow phosphor 5 can convert a blue light emitted from the light-emitting layer of the semiconductor layer 2a into a yellow light, and therefore the blue light is converted into the white light via a yellow/blue color mixture. In this case, the LED chip 2 can emit a white light so as to conform to a light distribution standard while shielding a portion of the emitted light with the shield electrode 3c.

Figure 6:
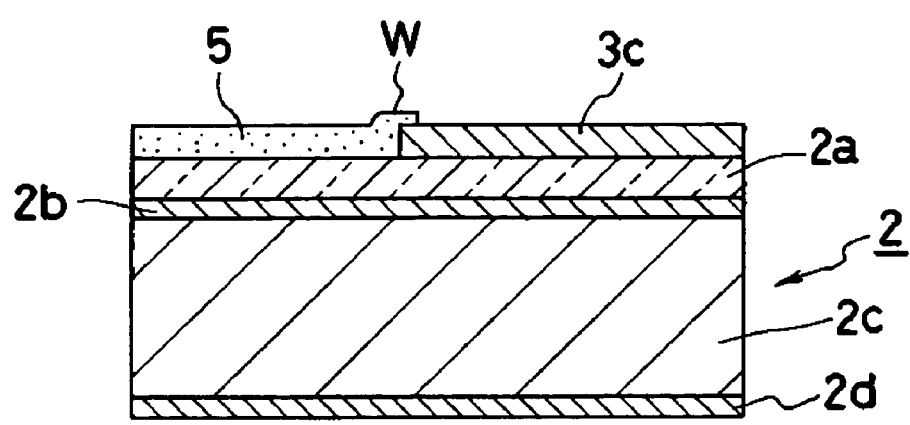
FIG. 6 is a cross-section view showing a coating state of a phosphor material on a top surface of the LED chip shown in FIG. 5.

FIG. 6 is a cross-section view showing a coating state of the yellow phosphor 5 on a top surface of the LED chip 2 shown in FIG. 5. Because the yellow phosphor 5 is a wavelength-conversion material and cannot emit a light therewith, the LED chip 2 can include a slightly overlapping part W of the yellow phosphor 5 formed on the shield electrode 3c if it is not so large as to affect the light distribution pattern of vehicle lamps using the light source 1.

Figure 7:
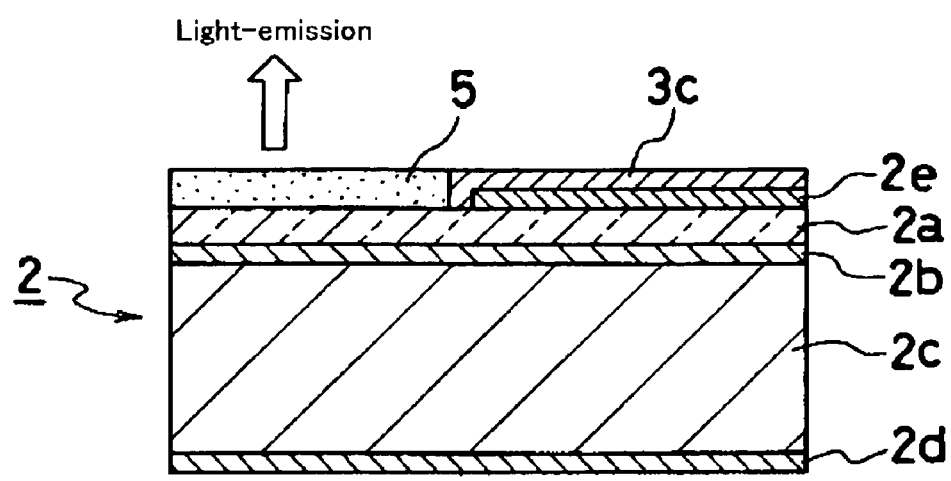
FIG. 7 is a schematic cross-section view showing a structure for another exemplary embodiment of an LED chip including a wavelength-conversion material in a light source device made in accordance with principles of the disclosed subject matter.

The above-described shield electrode 3c can be composed of gold layer (Au) and the like. However, Au is usually expensive and has characteristics that may absorb a light of single wavelength. FIG. 7 is a schematic cross-section view showing a structure for another exemplary embodiment of an LED chip including a wavelength-conversion material in a light source device made in accordance with principles of the disclosed subject matter.

The LED chip 2 shown in FIG. 7 can replace the shield electrode 3c with both a shield electrode 3c and a reflecting layer 2e. That is to say, the shield electrode 3c of FIG. 7 can be thinner than that of FIG. 5 and the reflecting layer 2e can be configured to form between the thin shield electrode 3c and the semiconductor layer 2a that is composed of InGaN layer, etc. In this case, a part of the shield electrode 3c can directly contact the top surface of the at least LED chip at a position close to the other edge line of the shield electrode. The reflecting layer 2e can be composed of an aluminum (Al) and/or the like, and can reflect light emitted from the emitting-layer of the semiconductor layer 2a towards the metallic layer 2b.

Thus, the reflecting layer 2e can reflect light that may be absorbed in the shield electrode 3c shown in FIG. 5, and the reflected light may be emitted as white light via the yellow phosphor 5 after repeating several reflections. Consequently, because the LED chip 2 in accordance with the structure shown in FIG. 7 can increase the amount of light thereof with respect to the structure shown in FIG. 5, the light use efficiency of the LED chip 2 using the structure can improve.

When the reflecting layer 2e is composed of Al, the brightness of the LED chip 2 can certainly improve because Al is a high reflective material. However, because Al is an electrically conductive metal, the LED chip 2 in accordance with the structure shown in FIG. 7 may draw the same current as that of the structure shown FIG. 5. Thus, the driving current can be decreased by replacing the above-described conductive metal with an insulating material in the LED chip 2 using the structure shown in FIG. 7.

Figure 8:
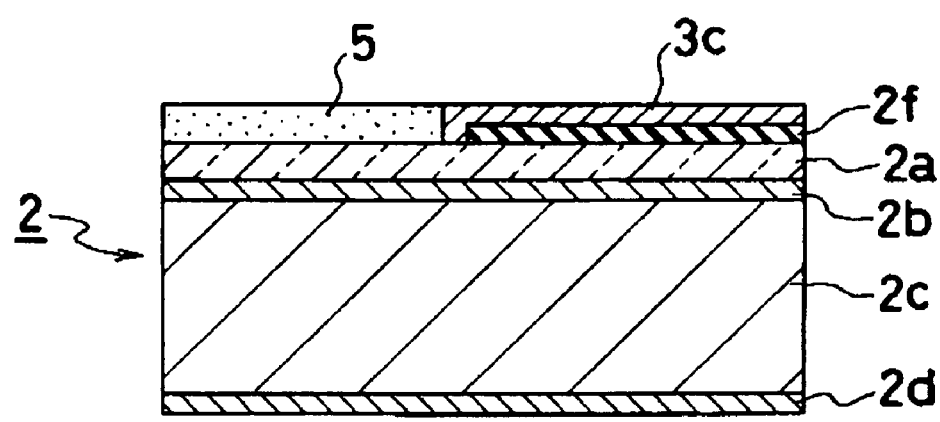
FIG. 8 is a cross-section view showing a structure of a variation for the LED chip shown in FIG. 7.

FIG. 8 is a cross-section view showing a structure of a variation for the LED chip shown in FIG. 7. The insulating layer 2f can be made by an insulating material such as titanium dioxide (TiO$_2$), etc. In this case, the insulating layer 2f can be located between the shield electrode 3c and the semiconductor layer 2a so that a part of the shield electrode 3c can directly contact the semiconductor layer 2a at a close position to the other edge line of the shield electrode 3c.

According to the above-described structure, the insulating layer 2f can result in a decrease of the approximately same current as compared to a current that flows between the semiconductor layer 2a and the reflecting layer 2f in the structure shown in FIG. 7. Therefore, the structure can result in a decrease of a heat generated by the LED chip 2.

In addition, the current density can be concentrated close to the other edge line of the shield electrode 3c towards the light-emitting surface. Thus, the light source 1 using this structure can enjoy both high power efficiency and more favorable light distribution, which can become brighter on an area under the cut-off line for illuminating at a far point on a road.

Figure 9:
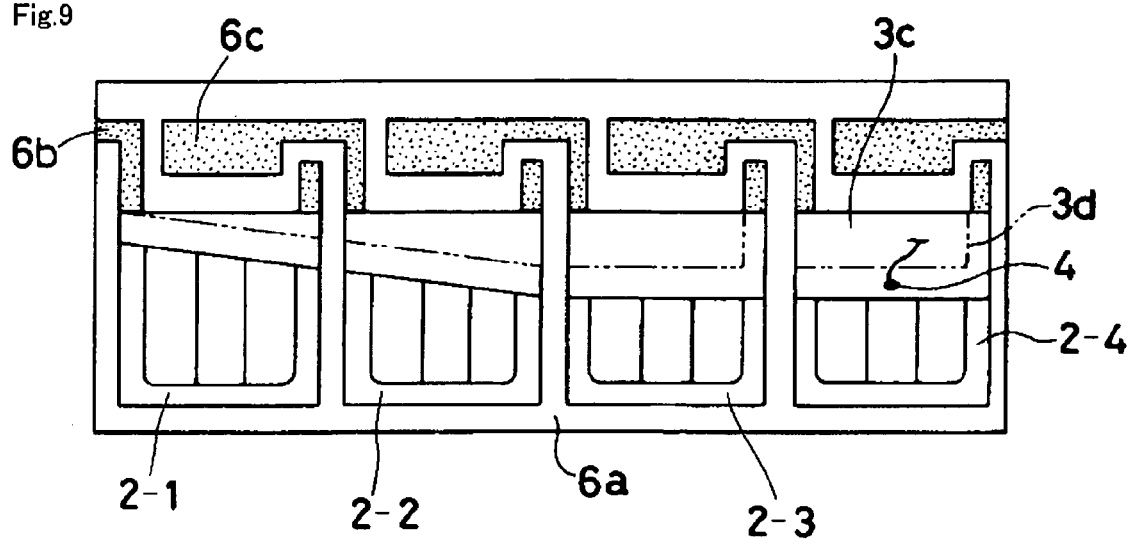
FIG. 9 is a schematic top view showing a structure of another variation for the LED chip shown in FIG. 7.

FIG. 9 is a schematic top view showing a structure of another variation for the LED chip shown in FIG. 7. The shield electrode 3c shown in FIG. 9 can include a slit 3d thereon so as to expose a portion of the reflecting layer 2e from the slit 3d in the structure shown in FIG. 7 and so as to expose a portion of the insulating layer 2f from the slit 3d in the structure shown in FIG. 8. The slit 3d of the shield electrode 3c can result in a decrease of approximately the same amount of current that generally corresponds to the amount of current that flows between the semiconductor layer 2a and the reflecting layer 2e corresponding to the slit 3d in the structure shown in FIG. 7.

Therefore, the LED chip 2 made in accordance with the structure shown in FIG. 9 can maintain nearly the same efficiency as that of the structure shown in FIG. 8, and the driving current thereof can also be adjusted by changing a shape of the slit 3d. In addition, because this structure can decrease an amount of gold (AU), or other material, used to produce the shield electrode 3c, the structure can result in a cost reduction.

The base board 6a shown in FIG. 9 can include four die bonding pads 6b and four wire bonding pads 6c thereon for mounting four LED chips in series. Thus, the wire bonding pad 6c for the LED chip 2-1 is connected to the die bonding pad 6b for the LED chip 2-2, and finally the wire bonding pad 6c for the LED chip 2-3 is connected to the die bonding pad 6b for the LED chip 2-4. The light source 1 can receive a power supply from the die bonding pad 6b for the LED chip 2-1 and the wire bonding pad 6c for the LED chip 2-4.

FIGS. 10(A), (B) are respectively schematic top and side cross-section views showing an exemplary location using four LED chips for a light source device made in accordance with principles of the disclosed subject matter. The light source 1 can include: a casing 6 providing a base board 6a on a bottom surface thereof; a lead frame 8a located on the base board 6a for the bonding pads 6b and four lead frames 8b-1 to 8b-4 on the base board 6a for the wire bonding pads 6c; four LED chips 2-1 to 2-4 mounted on the lead frame 8a via a conductive material, bottom electrodes thereof electrically connected to the lead frame 8a via the conductive material, and four top electrodes thereof electrically connected to the lead frames 8b-1 to 8b-4 via bonding wires, respectively; and encapsulating resin 7 disposed in the casing 6.

According to the above-described structure, because LED chips 2-1 to 2-4 are connected in parallel, each of brightness and color tone of the LED chips 2-1 to 2-4 can be adjusted by changing each driving current via their lead frames 8b-1 to 8b-4 and the lead frame 8a that can be used as a common electrode.

Moreover, because LED chips 2-1 to 2-4 can be electrically connected in parallel, it can be extremely unlikely that all or most of LED chips 2-1 to 2-4 might not emit due to an electrical problem with respect to the structure connected in series as shown in FIG. 9. All or most of LED chips 2-1 to 2-4 may not emit due to an electrical problem when the structure is connected in series. However, because at least one of the LED chips 2-1 to 2-4 may emit in the structure shown in FIG. 10, the structure can maintain high safety.

The above-described lead frames 8a and 8b can be insert-formed in the casing 6. The casing 6 can be also composed of an integral one piece casing with the base board 6a that is made by a high thermal conductive semiconductor substrate such as a silicon, the ceramic substrate, etc. The encapsulating resin 7 can be composed of a transparent resin such as an epoxy resin, silicon resin and the like, and can encapsulate both the LED chips 2-1 to 2-4 and their bonding wires. Thus, the encapsulating resin 7 can protect the LED chips 2-1 to 2-4 from an external environment such as a vibration, a shock, moisture, a dirt and dust, etc.

According to a result of a prototype headlight for a low beam using the light source 1, the prototype headlight can form a favorable light distribution pattern having a clear cut-off line, which is intended to prevent a glare light on an oncoming lane and can be easy to illuminate a road of driving lane, traffic signals, etc. In case of using conventional light sources, it can be desirable for the vehicle lamp for a low beam to have a shield plate located at a focus of a projection lens in order not to cause a glare light. However, because the shield electrode 3c can combine the electrode of the LED chip 2 with the shield plate, the light-emitting surface and the shield surface can be located at the almost same position. Thus, positioning between the light source 1 and the projection lens 10 can become very easy.

Thus, the disclosed subject matter can provide a light source with high light use efficiency and a favorable bright distribution, and can include vehicle lamps with a favorable light distribution pattern. In addition, the vehicle lamps can also be simply composed by the LED light source device described above when used as the light source. Various modifications of the above disclosed embodiments can be made without departing from the spirit and scope of the presently disclosed subject matter.

While there has been described what are at present considered to be exemplary embodiments of the invention, it will be understood that various modifications may be made thereto, and it is intended that the appended claims cover such modifications as fall within the true spirit and scope of the invention. All conventional art references described above are herein incorporated in their entirety by reference.

What is claimed is:

1. A light source device, comprising:
    a base board;
    a first electrode and a second electrode;
    at least one die bonding pad located adjacent the base board and electrically connected to the first electrode;
    at least one wire bonding pad located adjacent the base board and the at least one die bonding pad and electrically connected to the second electrode;
    at least one LED chip having a top surface including adjacent corner regions, a bottom surface located adjacent the at least one die bonding pad, a first chip electrode electrically connected to the at least one die bonding pad, and a second chip electrode forming an edge portion at the top surface of the at least one LED chip and located adjacent the at least one wire bonding pad, wherein the edge portion of the second chip electrode includes at least one of the adjacent corner regions of the top surface located toward the at least one wire bonding pad;
    a bonding wire electrically connecting the second chip electrode and the wire bonding pad; and
    an encapsulating resin disposed adjacent the base board and encapsulating each of the at least one LED chip and the bonding wire.

2. The light source device according to claim 1, further comprising:
    a distribution electrode including a plurality of strips adjacent the top surface of the at least one LED chip and connected to the second chip electrode at the top surface of the at least one LED chip.

3. The light source device according to claim 1, wherein the top surface of the at least one LED chip includes an exposed surface located beyond the second chip electrode; and
    the light source device further includes a wavelength-conversion material covering at least the exposed surface.

4. The light source device according to claim 2, wherein the top surface of the at least one LED chip includes an exposed surface located beyond the second chip electrode; and
    the light source device further includes a wavelength-conversion material covering at least the exposed surface.

5. The light source device according to claim 2, wherein the at least one LED chip includes at least one of a blue LED chip, an ultraviolet LED chip, a red LED chip, a yellow LED chip, and a mixture chip, where the mixture chip includes a red LED chip, a green LED chip and a blue LED chip.

6. A light source device, comprising:
    a base board;
    a first electrode and a second electrode;
    at least one die bonding pad located adjacent the base board and electrically connected to the first electrode;
    at least one wire bonding pad located adjacent the base board and the at least one die bonding pad and electrically connected to the second electrode;
    at least one LED chip having,
        a top surface having an edge line and adjacent corner regions located adjacent the at least one wire bonding pad and an exposed surface,
        a bottom surface connected to the at least one die bonding pad,
        a first chip electrode electrically connected to the at least one die bonding pad, and
        a shield electrode formed at the top surface of the at least one LED chip, covering the adjacent corner regions of the top surface, and including a first edge line substantially aligned with the edge line of the top surface of the at least one LED chip and located adjacent the at least one wire bonding pad, and a second edge line opposite the first edge line formed in a straight line at the top surface of the at least one LED chip;
    a bonding wire electrically connecting the shield electrode and the at least one wire bonding pad;
    a wavelength-conversion material covering at least the exposed surface of the top surface of the LED chip; and
    an encapsulating resin disposed adjacent the base board and encapsulating each of the at least one LED chip and the bonding wire.

7. The light source device according to claim 6, wherein the light source is configured for use as a vehicle lamp.

8. The light source device according to claim 6, further comprising:
    a distribution electrode including a plurality of strips at the top surface of the LED chip and connected to the shield electrode at the top surface of the at least one LED chip.

9. The light source device according to claim 8, wherein the bonding wire electrically connects the shield electrode to the at least one wire bonding pad at a position closer to the second edge line than the first edge line.

10. The light source device according to claim 9, further comprising:
    a reflecting layer located between the top surface of the at least one LED chip and the shield electrode, wherein a portion of the shield electrode directly contacts the top surface of the at least one LED chip adjacent to the second edge line of the shield electrode.

11. The light source device according to claim 10, wherein the reflecting layer includes an insulating material and the shield electrode includes a slit that exposes a part of the reflecting layer that lies below the slit.

12. A light source device, comprising:
    a base board;
    a first electrode and a second electrode;
    at least one die bonding pad located adjacent the base board and electrically connected to the first electrode;
    at least one wire bonding pad located adjacent the base board and the at least one die bonding pad and electrically connected to the second electrode;
    at least one LED chip having,
        a top surface having an edge line and an exposed surface,
        a bottom surface connected to the at least one die bonding pad,
        a first chip electrode electrically connected to the at least one die bonding pad, and
        a shield electrode formed at the top surface of the at least one LED chip, and including a first edge line substantially aligned with the edge line of the top surface of the at least one LED chip and located adjacent the at least one wire bonding pad, and a second edge line opposite the first edge line formed in a straight line at the top surface of the at least one LED chip;
    a bonding wire electrically connecting the shield electrode and the at least one wire bonding pad;

a wavelength-conversion material covering at least the exposed surface of the top surface of the LED chip; and an encapsulating resin disposed adjacent the base board and encapsulating each of the at least one LED chip and the bonding wire, wherein the bonding wire electrically connects the shield electrode to the at least one wire bonding pad at a position closer to the second edge line than the first edge line.

13. The light source device according to claim 12, further comprising:

a reflecting layer located between the top surface of the at least one LED chip and the shield electrode, wherein a portion of the shield electrode directly contacts the top surface of the at least one LED chip adjacent to the second edge line of the shield electrode.

14. The light source device according to claim 13, wherein the reflecting layer includes an insulating material and the shield electrode includes a slit that exposes a portion of the reflecting layer that lies below the slit.

15. The light source device according to claim 12, wherein the at least one LED chip includes a plurality of LED chips adjacent with respect to each other, and the second edge line of the shield electrode of at least one of the plurality of LED chips slants toward the second edge line of the shield electrode of another one of the plurality of LED chips.

16. The light source device according to claim 9, wherein the at least one LED chip includes a plurality of LED chips adjacent with respect to each other, and the second edge line of the shield electrode of at least one of the plurality of LED chips slants toward the second edge line of the shield electrode of another one of the plurality of LED chips.

17. The light source device according to claim 13, wherein the at least one LED chip includes a plurality of LED chips adjacent with respect to each other, and the second edge line of the shield electrode of at least one of the plurality of LED chips slants toward the second edge line of the shield electrode of another one of the plurality of LED chips.

18. The light source device according to claim 10, wherein the at least one LED chip includes a plurality of LED chips adjacent with respect to each other, and the second edge line of the shield electrode of at least one of the plurality of LED chips slants toward the second edge line of the shield electrode of another one of the plurality of LED chips.

19. A vehicle lamp including the light source device according to claim 16, comprising:

a projection lens located adjacent the light source device.

20. A vehicle lamp including the light source device according to claim 17, comprising:

a projection lens located adjacent the light source device.

21. A light source device, comprising:

a base board;

a first electrode and a second electrode;

an LED chip located adjacent the base board and electrically connected to the first electrode and second electrode, and the LED chip including a top light emitting surface having adjacent corner regions; and at least one of, a shielding electrode connected to the adjacent corner regions of the top light emitting surface of the LED chip and configured to block light emitted from the LED chip to form a light distribution pattern, the shielding electrode electrically connected with at least one of the first electrode and second electrode, and electrically connected to the LED chip, such that when a pre-set electric current passes through the shielding electrode the LED chip emits light, and a distribution electrode connected to the adjacent corner regions of the top light emitting surface of the LED chip and including a plurality of elongate strips locate adjacent each other and covering a majority of the top light emitting surface of the LED chip, the distribution electrode electrically connected with at least one of the first electrode and second electrode, and electrically connected to the LED chip, such that when a pre-set electric current passes through the distribution electrode the LED chip emits light.

22. The light source device according to claim 21, further comprising:

a bonding wire electrically connecting the shielding electrode and the first electrode.

23. The light source device according to claim 22, further comprising:

an encapsulating resin disposed adjacent the base board and encapsulating each of the at least one LED chip, the bonding wire, and the shielding electrode.

24. The light source device according to claim 21, further comprising:

a reflecting layer located between the top surface of the LED chip and the shield electrode, wherein a portion of the shield electrode directly contacts the top surface of the LED chip adjacent to a second edge line of the shield electrode that forms a light distribution cutoff.

25. The light source device according to claim 21, wherein the shielding electrode includes an outermost peripheral first edge on a first side of the shielding electrode and a second outermost peripheral edge located on a second side of the shielding electrode, the first side of the shielding electrode being directly opposed to the second side of the shielding electrode, the shielding electrode includes a slit opening spaced from the second outermost peripheral edge.

* * * * *